(12) United States Patent
Ting et al.

(10) Patent No.: US 11,991,827 B2
(45) Date of Patent: May 21, 2024

(54) ELECTRONIC DEVICE

(71) Applicant: Advanced Semiconductor Engineering, Inc., Kaohsiung (TW)

(72) Inventors: Chun-Yen Ting, Kaohsiung (TW); Pao-Nan Lee, Kaohsiung (TW); Hung-Chun Kuo, Kaohsiung (TW); Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 33 days.

(21) Appl. No.: 17/966,701

(22) Filed: Oct. 14, 2022

(65) Prior Publication Data
US 2024/0130043 A1   Apr. 18, 2024

(51) Int. Cl.
*H05K 1/14* (2006.01)
(52) U.S. Cl.
CPC .................. *H05K 1/141* (2013.01)

(58) Field of Classification Search
USPC ........................................... 361/785
See application file for complete search history.

(56) References Cited

U.S. PATENT DOCUMENTS

| | | | |
|---|---|---|---|
| 7,279,795 B2 | 10/2007 | Periaman et al. | |
| 2009/0319820 A1* | 12/2009 | Wu | G06F 1/08 713/600 |
| 2021/0208649 A1* | 7/2021 | Ji | G06F 1/263 |

* cited by examiner

*Primary Examiner* — Andargie M Aychillhum
(74) *Attorney, Agent, or Firm* — FOLEY & LARDNER LLP

(57) ABSTRACT

An electronic device is disclosed. The electronic device includes a system board and a first set of electronic devices disposed over the system board. Each of the first set of electronic devices comprises a processing unit and a carrier carrying the processing unit. The electronic device also includes a first interconnection structure electrically connected with the processing unit through the carrier and configured to receive a first power from a first power supply unit and to transmit the first power to the processing unit.

17 Claims, 7 Drawing Sheets

ELECTRONIC DEVICE

BACKGROUND

1. Field of the Disclosure

The present disclosure generally relates to an electronic device.

2. Description of the Related Art

High-performance computing (HPC) systems utilize peripheral component interconnect express (PCIe) expansion cards (such as a graphics accelerator card) in addition to a central processing unit (CPU) to speed processing-intensive operations. The edge-board contacts of the PCIe expansion card may be seated in a PCIe slot of a system board to provide a power routing path transmitting power to the PCIe expansion card.

The voltage and power requirements of multiple graphics processing units (GPUs) on the graphics accelerator card vary. To support the rapid increase in the total number and variety of GPUs and a corresponding increase in the number of power routing paths, a larger system board and/or a larger graphics accelerator card with more edge-board contacts may be required with manufacturing costs inevitably increasing.

SUMMARY

In some embodiments, an electronic device includes a system board and a first set of electronic devices disposed over the system board. Each of the first set of electronic devices comprises a processing unit and a carrier carrying the processing unit. The electronic device also includes a first interconnection structure electrically connected with the processing unit through the carrier and configured to receive a first power from a first power supply unit and to transmit the first power to the processing unit.

In some embodiments, an electronic device includes a system board and a plurality of electronic devices disposed over the system board. Each of the plurality of electronic devices comprises a processing unit and a carrier carrying the processing unit. The electronic device also includes an interconnection structure connected with the carrier of at least one of the plurality of electronic devices. The carrier of the at least one of the plurality of electronic devices is configured to receive a first power from the interconnection structure and to receive a second power from the system board.

In some embodiments, an electronic device includes a system board and a first electronic device comprising a first carrier and a first processing unit configured to receive a first power from the system board through the first carrier. The electronic device also includes a second electronic device disposed over the system board. The second electronic device comprises a second carrier and a second processing unit carried by the second carrier. The electronic device also includes an interconnection structure electrically connected to the second electronic device and configured to transmit a second power from a power supply unit to the second processing unit without passing through the system board.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
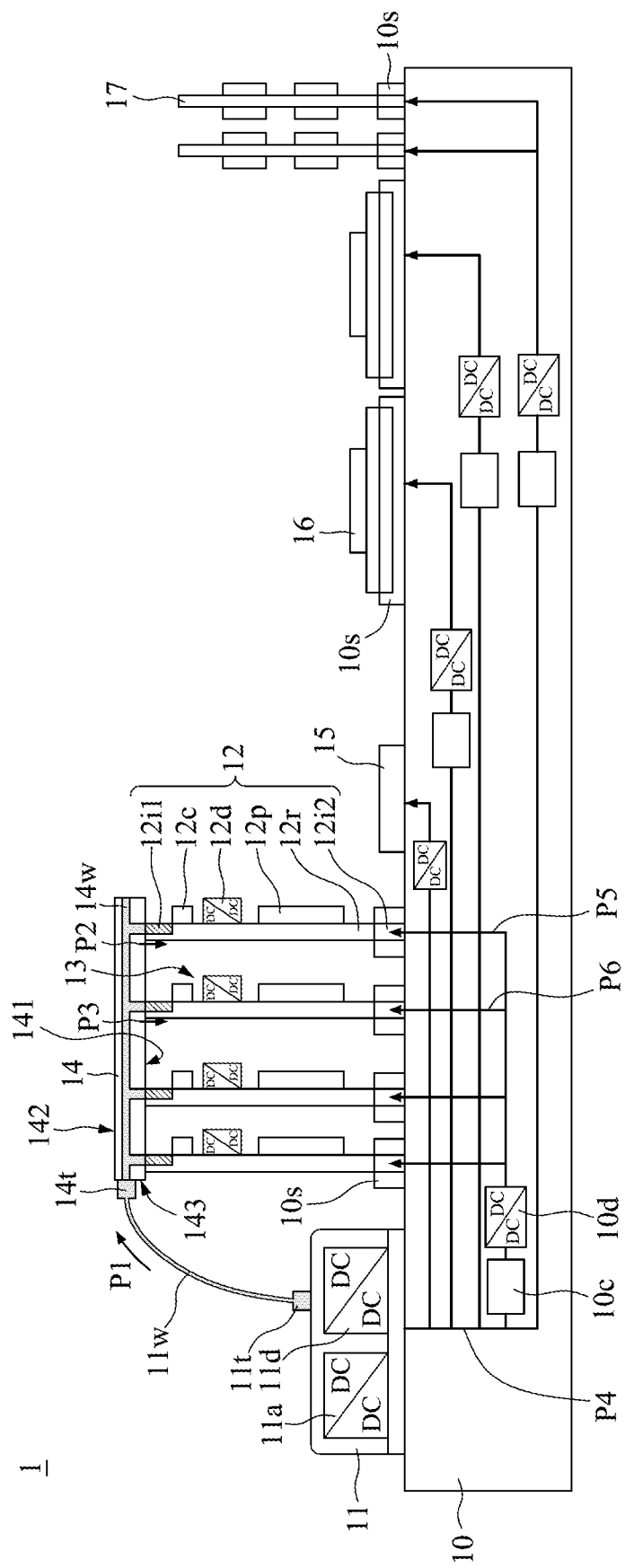
FIG. 1 is a side view of an exemplary electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a side view of an exemplary electronic device 1 according to some embodiments of the present disclosure. In some arrangements, the electronic device 1 may include a computer system or be a part of a computer system. The electronic device 1 may be provided to suit different requirements, depending on the intended use of the computer system. For example, the electronic device 1 may provide data transfer, data processing, data management and maintenance, or other functions. The electronic device 1 may include a carrier 10, a power supply unit 11, electronic components 12, 13, 15, 16, 17, and an interconnection structure 14.

The carrier 10 may include a system board, a main board, or a main printed circuit board (PCB). In some arrangements, the components (such as the power supply unit 11 and the electronic components 12, 13, 15, 16, and 17 in FIG. 1) of the electronic device 1 may be located over or attached to the same carrier 10. In some other embodiments, the electronic device 1 may include multiple separate carriers, and the components may be located over or attached to separate carriers.

The carrier 10 may include an interconnection structure, such as a redistribution layer (RDL), a circuit layer, a conductive trace, a conductive via, etc. The interconnection structure may provide signal paths for the components electrically connected to the carrier 10. For example, the carrier 10 may hold and allow communication among the components mounted over it. As used herein, a signal path may refer to a path through which an electrical signal may be transmitted. Such an electrical signal may include either analog or digital signals. Additionally, a power routing path (or a power path) may refer to a path dedicated to power supply connections.

In some arrangements, the electronic device 1 may include slots 10s for connecting the electronic components (or electronic devices) 12, 13, 16, and 17. In some other arrangements, the electronic device 1 may include other peripheral devices or computer hardware such as a hard disk, an input device, an output device, a memory device, a communication device, etc.

The power supply unit 11 may be configured to supply power (or a power signal) for charging and/or operating the components (such as the electronic components 12, 13, 15, 16, and 17 in FIG. 1) of the electronic device 1. The power supply unit 11 may include circuitry, such as an AC-to-DC (AC/DC) converter 11a and a DC-to-DC (DC/DC) converter 11d.

The power supply unit 11 may be configured to convert alternating current (AC) (from mains power supply) to a direct current (DC), to convert an input power to a lower voltage level, and provide further conditioning (e.g. power factor correction, noise suppression, transient impulse protection, etc.) of the input power, etc. The power supply unit 11 may be then configured to provide low-voltage DC to the interconnection structure 14 and the electronic components 12, 13, 15, 16, and 17.

In some arrangements, the power supply unit 11 may include other circuitry or components, such as a carrier (a substrate or a PCB), a component for communication, a microcontroller, power or current sense circuitry, power or current regulation circuitry, etc. One or more of the circuitry or components may be integrated into an assembly by way of an encapsulant. For example, the AC/DC converter 11a, the DC/DC converter lid, and other circuitry or components (if any) may be supported by a carrier and encapsulated by an encapsulant. However, in some other arrangements, the AC/DC converter 11a, the DC/DC converter 11d, and/or the other circuitry or components may be external to the encapsulant.

The power supply unit 11 may be disposed over or on the carrier 10. However, the positions and number of the power supply units in the electronic device 1 are not intended to limit the present disclosure. For example, the power supply unit 11 may not be disposed over the carrier 10. In some other arrangements, the power supply unit 11 may be disposed over or on another carrier separate from the carrier 10. In some other arrangements, another power supply unit may supply power for charging and/or operating the components of the electronic device 1.

Multiple electronic components (such as the electronic components 12 and 13) may be disposed over or on the carrier 10. In some arrangements, the electronic components (such as the electronic components 12 and 13) may each include an expansion card, such as a graphics accelerator card, video card, sound card, network card, or other printed circuit board that can be seated in the slot 10s of the carrier 10 to enhance the quality of their specific function and to add functionality to the electronic device 1. For example, the electronic components (such as the electronic components 12 and 13) may configured to support or speed processing-intensive operations of the electronic component 16.

The electronic components (such as the electronic components 12 and 13) may respectively be seated in one of the slots 10s of the carrier 10. The slots 10s may include an accelerated graphics port (AGP), a peripheral component interconnect (PCI) slot, a PCI Express (PCIe) slot, or other expansion slots. In some other arrangements, the carrier 10 may include sockets, connectors, latches, levers, or clips to fix the electronic components (such as the electronic components 12 and 13).

The interconnection structure 14 may be disposed over the electronic components (such as the electronic components 12 and 13). The interconnection structure 14 may be carried by the electronic components (such as the electronic components 12 and 13). In some arrangements, the interconnection structure 14 may include an interposer or include interposer-like wiring to form a structure which may be regarded as an interposer or a fan-out substrate. In some arrangements, the interconnection structure 14 may include a monolithic structure.

The interconnection structure 14 may be electrically connected to each of the electronic components (such as electronic components 12 and 13). For example, the interconnection structure 14 may include a conductive element 14w, such as an RDL, a circuit layer, a conductive trace, a conductive via, etc. The interconnection structure 14 may include a surface 141 facing the electronic components (such as the electronic components 12 and 13), a surface 142 opposite to the surface 141, and a lateral surface 143 extending between the surfaces 141 and 142. The lateral surface 143 may be substantially perpendicular to the surface 141 and the surface 142. The interconnection structure 14 may include one or more conductive pads (not shown) in proximity to, adjacent to, or embedded in and exposed by the surface 141.

In some arrangements, the interconnection structure 14 may include an interconnect component (such as a substrate, an interposer, a PCB or a bridge component) configured to receive power from the power supply unit 11 and provide multiple power paths to the electronic components (such as the electronic component 12 and the electronic component 13).

For example, the interconnection structure 14 may be configured to receive power from the power supply unit 11 through a conductive element 11w, as illustrated by the power path P1. The conductive element 11w may include a conductive wire, a cable (such as an Ethernet cable), a flexible flat cable (FFC), or an insulated wire having a protective casing. In other arrangements, a flexible printed circuit (FPC) may be used in place of the conductive element 11w to provide the power path P1. The conductive element 11w may have one end connected to the power supply unit 11 by a connector 11t and another end connected to the interconnection structure 14 by a connector 14t. The connectors 11t and 14t may each include an RJ45 connector or other suitable wire-to-board connectors. In some arrangements, the connector 14t may be provided over or on the lateral surface 143 of the interconnection structure 14. The lateral surface 143 may be closer to the power supply unit 11 than the surface 141 and the surface 142. Therefore, by arranging the connector 14t over or on the lateral surface 143, the power path P1 can be shorter than if arranging the connector 14t over the surface 141 or the surface 142.

The power from the connector 14t may be transmitted through the conductive element 14w, as illustrated by the power path P1, and distributed toward each of the electronic components (such as the electronic components 12 and 13), as illustrated by the power paths P2 and P3.

The electronic component 12 may include a carrier 12r, interfaces 12i1, 12i2, a processing unit 12p, a controller 12c, and a DC/DC converter 12d. The carrier 12r may include or be a substrate or a PCB. The carrier 12r may be electrically connected to the interconnection structure 14 through the interface 12i1. The carrier 12r may be electrically connected to one of the slots 10s of the carrier 10 through the interface 12i2. The electronic component 12 may be attached, removed, and reattached with respect to the slots 10s of the carrier 10 through the carrier 12r. The electronic component 12 may be detachable from the slots 10s of the carrier 10 through the carrier 12r.

In some arrangements, the interfaces 12i1 and 12i2 may each include edge-board contacts, gold fingers, or input/output (I/O) pins for carrying or transmitting electrical signals, power signals, or both.

For example, the interface 12i1 may be configured to receive power from the interconnection structure 14. For example, the interface 12i1 may be configured to provide, define, construct, or establish the power path P2 for transmitting power from the interconnection structure 14 to the carrier 12r.

For example, the interface 12i2 may be configured to receive power from the carrier 10. For example, the interface 12i2 may be configured to provide, define, construct, or establish the power path P5 for transmitting power from the carrier 10 to the carrier 12r.

The controller 12c may be electrically connected to the carrier 12r by way of flip-chip or wire-bond techniques. In some arrangements, the controller 12c may include a multiphase controller or a power controller. For example, the controller 12c may include a power management integrated circuit (PMIC), one or more voltage regulators, and/or one or more converters. Examples of the voltage regulator may include a linear regulator (which is configured to maintain a constant output voltage) or a switching regulator (which is configured to generate an output voltage higher than or lower than an input voltage). Examples of the converters may include a step-down (buck) converter, a step-up (boost) converter, an analog-to-digital converter, a digital-to-analog converter, an AC/DC converter, a DC/DC converter, other types of converters, or a combination thereof.

The controller 12c may be configured to receive power from the interface 12i1 through the interconnection structure 14 (as indicated by the power path P2), to regulate the power and provide the regulated power to the processing unit 12p. Alternatively or additionally, the controller 12c may be configured to receive power from the interface 12i2 through the carrier 10 (as indicated by the power path P5), to regulate the power and to provide the regulated power to the processing unit 12p. In some arrangements, the regulated power is provided to the backside or rear surface of the processing unit 12p, as shown in FIGS. 2C and 2D. Therefore, more I/O pins can be used to transmit an electronic signal through the active surface of the processing unit 12p.

The processing unit 12p may be electrically connected to the carrier 12r by way of flip-chip or wire-bond techniques. In some arrangements, the active surface of the processing unit 12p may face the carrier 12r and the rear surface of the processing unit 12p may face away from the carrier 12r. In some arrangements, the rear surface of the processing unit 12p may be configured to receive power from the interface 12i1 and/or the interface 12i2.

In some arrangements, the processing unit 12p may include an active component that relies on an external power supply to control or modify electrical signals. For example, the processing unit 12p may include a system on chip (SoC), a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some arrangements, the processing unit 12p may include a device package or a bare die.

The positions and number of the processing units in the electronic component 12 are not intended to limit the present disclosure. For example, there may be any number of power processing units in the electronic component 12 due to design requirements.

The multiple electronic components including the electronic component 13 may include similar or the same configurations as the electronic component 12. The details of the multiple electronic components including the electronic component 13 are not repeated hereafter for conciseness and clarity.

The electronic component 15 may be disposed over or on the carrier 10. The electronic component 15 may include a switching module. The electronic component 15 may include a network interface module (NIM). The electronic component 15 may be configured to interface incoming signals from outside the electronic device 1 into receivers (not shown in the figures, such as radio frequency (RF) receivers) of the electronic device 1. The electronic component 15 may be configured to connect components (such as computers, printers, and wireless access points) in a network to each other, and allow them to communicate by exchanging data packets. The electronic component 15 may include a smart network interface card (NIC). In some arrangements, the NIC may allow for an Ethernet connection to external components.

The electronic component 16 may be seated in one of the slots 10s of the carrier 10. In some arrangements, the electronic component 16 may include an active component that relies on an external power supply to control or modify electrical signals. For example, the electronic component 16 may include a processor, a controller, a memory, or an I/O buffer, etc. For example, the electronic component 16 may include a SoC, a CPU, a MPU, a GPU, a MCU, an ASIC, a FPGA, or another type of integrated circuit. In some arrangements, the electronic component 16 may include a device package or a bare die.

The electronic component 17 may be seated in one of the slots 10s of the carrier 10. In some arrangements, the electronic component 17 may include a non-volatile memory (such as a flash memory and a read-only memory (ROM)) or a volatile memory (such as a Dynamic Random Access Memory (DRAM)). In some arrangements, the electronic component 17 may include high bandwidth memory (HBM). In some arrangements, the electronic component 17 may be configured to be accessed by, for example, the electronic components 12, 13, 15, and 16. The electronic component 17 may be configured to support data storage and retrieval operations with the electronic components 12, 13, 15, and 16.

The electronic component 17 may include a plurality of memory chips or memory cards. For example, two memory chips may be disposed over or on the carrier 10 as shown in FIG. 1. There may be more or fewer depending on the application. The number of memory chips may be determined based on, for example, power, cost, heat, and capacity budgets. In some embodiments, the electronic component 17 may also include a memory controller to manage access to the memory chips and provide memory management and maintenance.

In some arrangements, the carrier 10 may provide power and/or ground connections to the components electrically connected to the carrier 10. For example, the carrier 10 may be configured to provide, define, construct, or establish power paths P4, P5, and P6. The power path P4 may be configured to transmit power from the power supply unit 11 to each of the electronic components 12, 13, 15, 16, and 17.

For example, power from the power supply unit 11 may be transmitted to the electronic component 12 (through the interface 12i2) as indicated by the power path P5 and be transmitted to the electronic component 13 as indicated by the power path P6.

In some arrangements, the carrier 10 may include one or more power regulating components 10c and one or more DC/DC converters 10d. The power transmitted from the power supply unit 11 may range between about 12.0 to 18.0V and may be received as an input power by the one or more power regulating components 10c. The one or more power regulating components 10c may receive the input power, regulate the input power, and provide regulated power (which may range between about 0.6 to 1.0V) to each of the electronic components 12, 13, 15, 16, and 17.

The configuration and the number of the power paths P4, P5, and P6, the power regulating components 10c, and the DC/DC converters 10d are not limited to the present disclosure. For example, in some other arrangements, each power path for the electronic components 12, 13, 15, 16, and 17 may include a power regulating component and a DC/DC converter. Further, in other arrangements, a power regulating component and a DC/DC converter may be shared by two or more of the power paths for the electronic components 12, 13, 15, 16, and 17.

In some arrangements, the power transmitted from the power supply unit 11 to the interconnection structure 14 may range between about 0.6 to 1.0V. The interconnection structure 14 may receive the power from the power supply unit 11 and transmit the power to the electronic components (including the electronic components 12 and 13) connected to the interconnection structure 14.

Therefore, the electronic component 12 may receive power through the power path P2 bypassing the carrier 10 and receive power through the power path P4 passing the carrier 10. The electronic component 13 may receive power through the power path P3 bypassing the carrier 10 and receive power through the power path P6 passing the carrier 10.

In some arrangements, the power (which may range between about 0.6 to 1.0V) transmitted through the power path P1 and received at the interconnection structure 14 may be lower than the power (which may range between about 12.0 to 18.0V) transmitted through the power path P4 and received at the power regulating components 10c in the carrier 10.

Therefore, a relatively lower power from the power supply unit 11 may be transmitted to the electronic components (including the electronic components 12 and 13) connected to the interconnection structure 14 through the power path P1. A relatively higher power from the power supply unit 11 may be transmitted to the electronic components (including the electronic components 12 and 13) connected to the interconnection structure 14 through the power path P4.

In some arrangements, since the power paths P4, P5, and P6 in the carrier 10 may be arranged around the non-power path(s) in the carrier 10 to reduce electromagnetic interference, the lengths of the power paths P4, P5, and P6 in the carrier 10 may be greater than the length of the power path P1.

In some other arrangements, the power path transmitted to at least one of the electronic components may either pass the carrier 10 or bypass the carrier 10. For example, the electronic component 12 may receive power through the power path P2 bypassing the carrier 10 and does not receive power through the power path P4 passing the carrier 10. For example, the electronic component 12 may receive power through the power path P4 passing the carrier 10 and does not receive power through the power path P2 bypassing the carrier 10.

In some other arrangements, the carrier 12r of the electronic component 12 may not be electrically connected with the interconnection structure 14. For example, the carrier 12r of the electronic component 12 may be electrically unconnected with the interconnection structure 14. For example, the carrier 12r of the electronic component 12 may provide structural support for the interconnection structure 14 and there may be no electrical signal being transmitted therebetween. For example, parasitic capacitive coupling may present between the carrier 12r of the electronic component 12 and the interconnection structure 14. However, there may be no electrical signal having a function or information therebetween.

According to some embodiments of the present disclosure, by providing power to the multiple electronic components (including the electronic components 12 and 13) through the interconnection structure 14, the power can be transmitted outside of a system board (such as the carrier 10) through the power path P1 in addition to being transmitted by the system board through the power path P4. Therefore, more power paths may be provided to the multiple electronic components. In some arrangements, different types of power control and/or different voltages of power may be provided to different processing units (such as the processing unit 12p of the electronic component 12).

In addition, since the number of power paths inside the system board can be reduced, the issue of interference (such as noise or interference generated from the electromagnetic interference (EMI) field) between the power paths can be resolved or alleviated. More I/O pins on the system board may be used to transmit signals. Therefore, the performance of the electronic device 1 can be enhanced.

Furthermore, the power may be transmitted to the processing units (such as the processing unit 12p of the electronic component 12) through the rear surfaces thereof without occupying I/O pins on the active surfaces. Thus, more I/O pins on the active surfaces can be used to transmit an electronic signal. All in all, package size can be miniaturized, signal propagation delay reduced, and electronic performance improved.

Figure 2B:
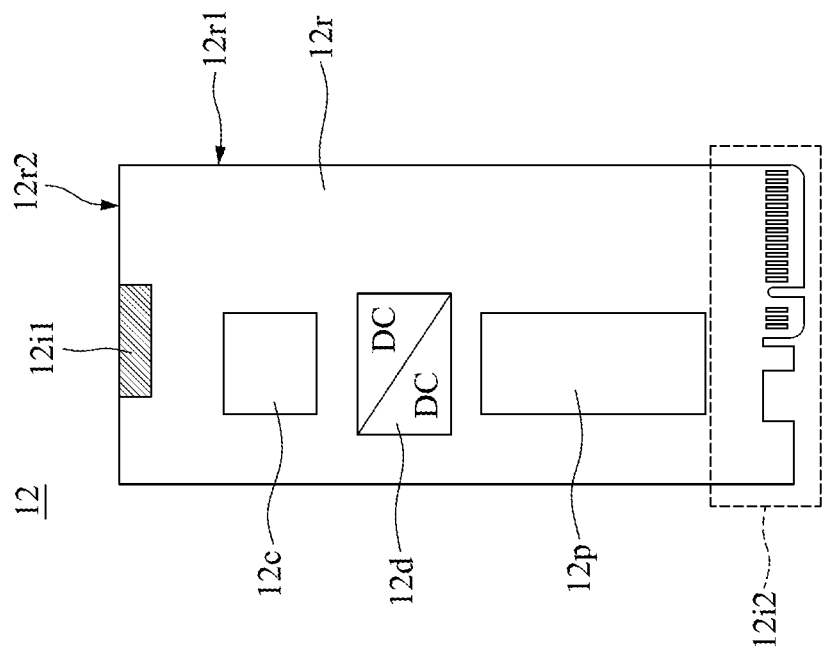
FIG. 2B is a top view of a part of an exemplary electronic device according to some embodiments of the present disclosure.
Figure 2A:
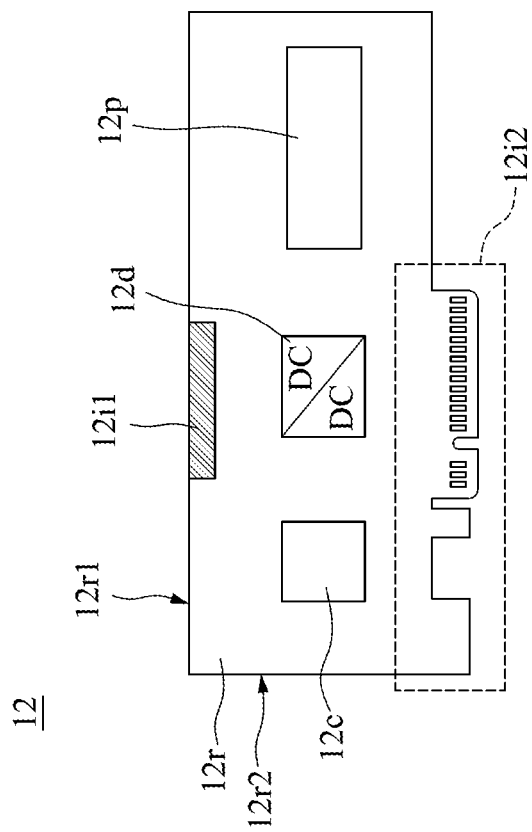
FIG. 2A is a top view of a part of an exemplary electronic device according to some embodiments of the present disclosure.
Figure 2C:
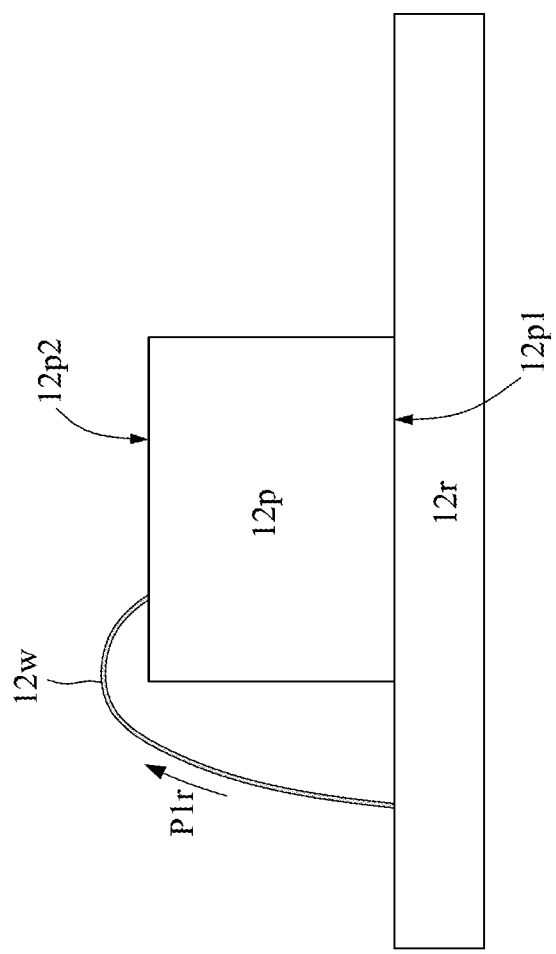
FIG. 2C is a side view of a part of an exemplary electronic device according to some embodiments of the present disclosure.
Figure 2D:
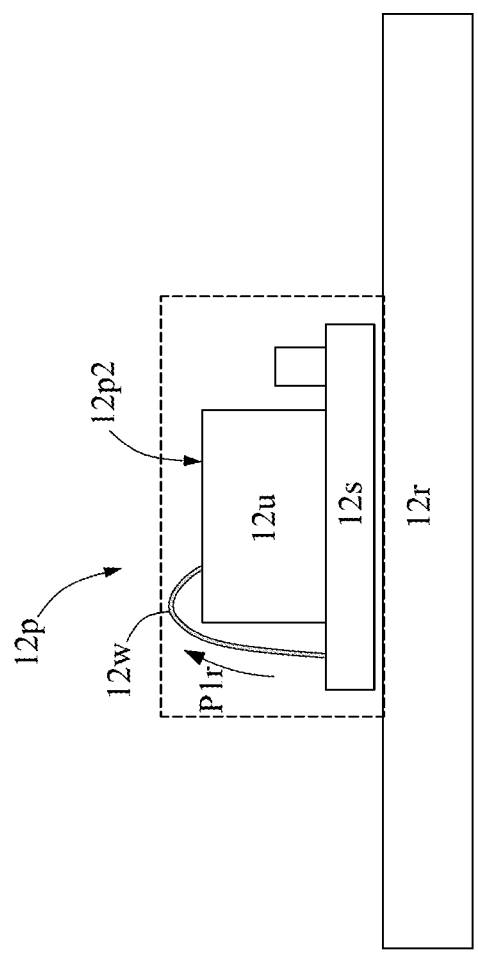
FIG. 2D is a side view of a part of an exemplary electronic device according to some embodiments of the present disclosure.

FIGS. 2A and 2B are top views of a part of an exemplary electronic device according to some embodiments of the present disclosure. In some arrangements, FIGS. 2A and 2B are top views of the electronic component 12 of the electronic device 1 in FIG. 1.

Referring to FIG. 2A, the carrier 12r may be rectangular and include relatively long sides 12r1 and relatively short sides 12r2. The interfaces 12i1 and 12i2 may be provided on the long sides 12r1 of the carrier 12r. The interfaces 12i1 and 12i2 may be disposed opposite to each other. In some arrangements, the interfaces 12i1 and 12i2 may be adjacent to the edge or boundary of the carrier 12r. By arranging the interfaces 12i1 and 12i2 on the long sides 12r1 of the carrier 12r, more I/O pins can be used for carrying or transmitting electrical signals, power signals, or both.

Referring to FIG. 2B, the interfaces 12i1 and 12i2 may be provided on the short sides 12r2 of the carrier 12r. The interfaces 12i1 and 12i2 may be disposed opposite to each other. In some arrangements, the interfaces 12i1 and 12i2 may be adjacent to the edge or boundary of the carrier 12r. By arranging the interfaces 12i1 and 12i2 on the short sides 12r2 of the carrier 12r, the carrier 12r may be electrically connected to one of the slots 10s of the carrier 10 as shown in FIG. 1 through the short sides 12r2. The dimensions (such as width, length, or area) of the carrier 10 can be decreased to further reduce the package size of the electronic device 1.

FIG. 2C is a side view of a part of an exemplary electronic device according to some embodiments of the present disclosure. Some elements are not illustrated in FIG. 2C for conciseness. The processing unit 12p may have an active surface 12p1 facing the carrier 12r and a backside or rear surface 12p2 opposite to the active surface 12p1. The regulated power (which may be regulated by the controller 12c in FIG. 1) P1r may be provided to the backside surface 12p2 of the processing unit 12p through a connector 12w. The connector 12w may include a conductive wire.

FIG. 2D is a side view of a part of an exemplary electronic device according to some embodiments of the present disclosure. Some elements are not illustrated in FIG. 2D for conciseness. The processing unit 12p may have a substrate 12s and an electronic unit 12u disposed over the substrate 12s. The regulated power (which may be regulated by the controller 12c in FIG. 1) P1r may be provided to the backside surface 12p2 of the electronic unit 12u through the substrate 12s and the connector 12w.

Figure 3:
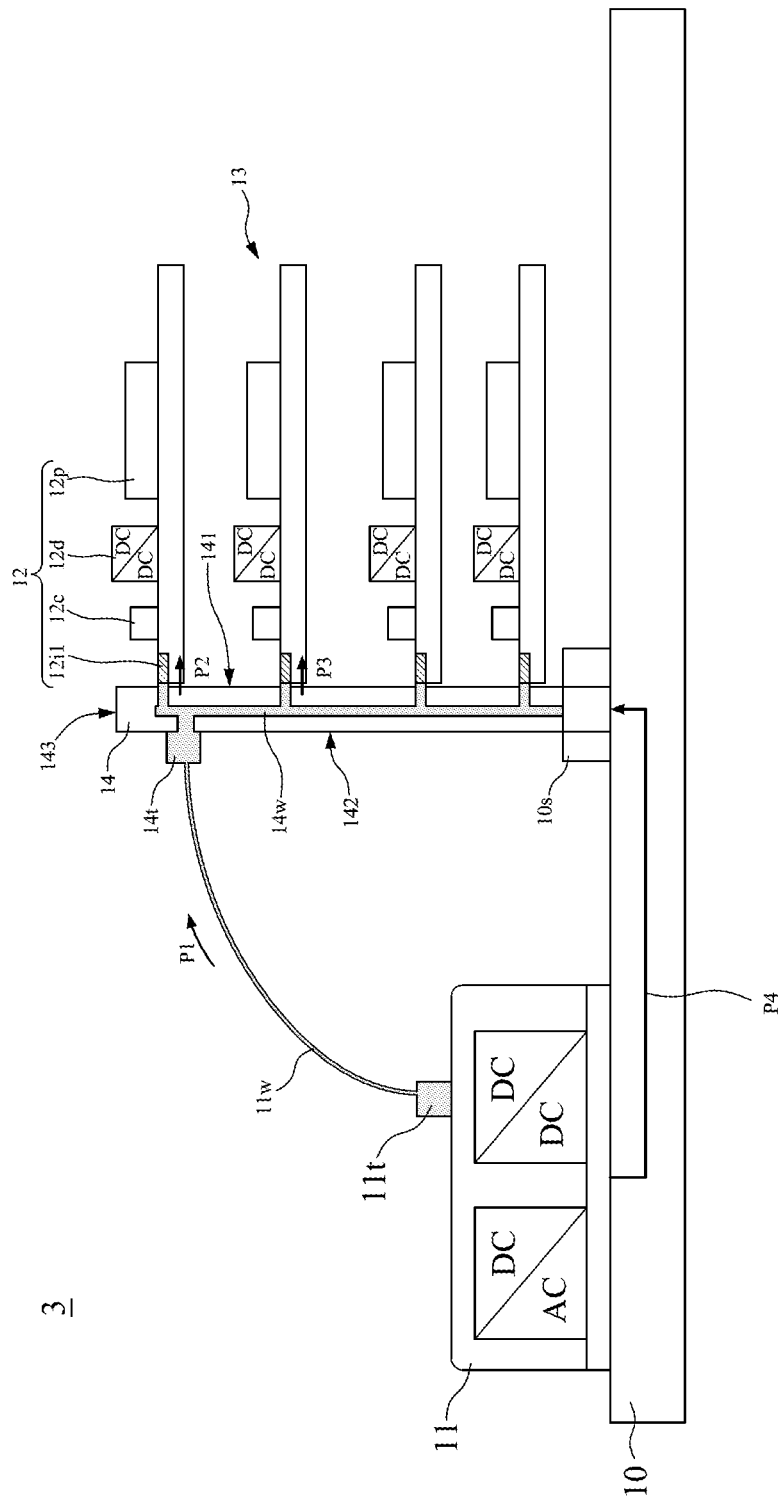
FIG. 3 is a side view of an exemplary electronic device according to some embodiments of the present disclosure.

FIG. 3 is a side view of an exemplary electronic device 3 according to some embodiments of the present disclosure. The electronic device 3 in FIG. 3 is similar to the electronic device 1 in FIG. 1, with differences therebetween as follows.

The interconnection structure 14 may be seated in the slot 10s of the carrier 10. In some arrangements, the connector 14t may be provided over or on the surface 142 of the interconnection structure 14 to reduce the power path P1. The interconnection structure 14 may be attached, removed, and reattached with respect to the slot 10s of the carrier 10 through the carrier 12r. The interconnection structure 14 may be detachable from the slot 10s of the carrier 10 through the carrier 12r.

In some arrangements, multiple electronic components (such as the electronic components 12 and 13) may each be electrically connected to the interconnection structure 14. For example, the multiple electronic components (such as the electronic components 12 and 13) may each be electrically connected to the carrier 10 through the interconnection structure 14. In some arrangements, the multiple electronic components (such as the electronic components 12 and 13) may each be physically spaced apart from the carrier 10.

In some arrangements, the multiple electronic components may be supported or carried by the interconnection structure 14. For example, the interconnection structure 14 may provide structural support for the multiple electronic components. In some arrangements, the interconnection structure 14 may contact lateral surfaces of the multiple electronic components. In some arrangements, the lateral surfaces of the multiple electronic components may be substantially perpendicular to a top surface of the carrier 10.

The multiple electronic components may receive power through the power path P1 bypassing the carrier 10. In addition, the multiple electronic components may receive power through the power path P4 passing the carrier 10 and the interconnection structure 14.

According to some embodiments of the present disclosure, by connecting the multiple electronic components (such as the electronic components 12 and 13) with the carrier 10 through the interconnection structure 14, the dimensions (such as width, length, or area) of the carrier 10 can be decreased to further reduce the package size of the electronic device 3.

Figure 4:
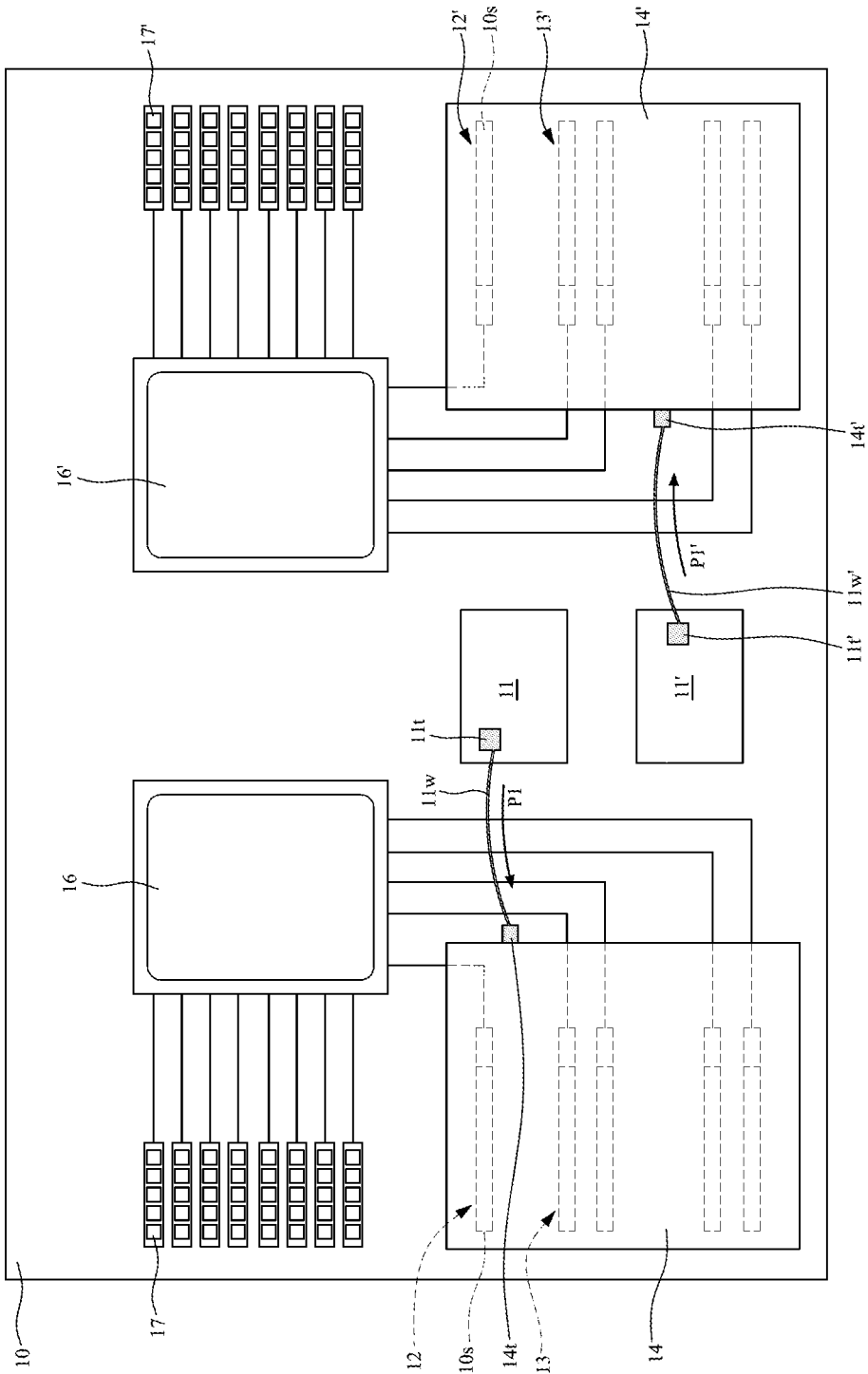
FIG. 4 is a top view of a part of an exemplary electronic device according to some embodiments of the present disclosure.

FIG. 4 is a top view of a part of an exemplary electronic device 4 according to some embodiments of the present disclosure. In some arrangements, the electronic device 1 in FIG. 1 may include the top view in FIG. 4.

The electronic device 4 may include the carrier 10, the power supply unit 11, the electronic components 12, 13, 16, 17, and the interconnection structure 14.

The electronic components 12 and 13 may respectively be seated in one of the slots 10s of the carrier 10. The electronic components 12 and 13 may each include an expansion card, such as a graphics accelerator card, video card, sound card, network card, or other printed circuit board. The electronic components 12 and 13 may each be electrically connected to the electronic component 16 through the carrier 10. The electronic components 12 and 13 may each be configured to support or speed processing-intensive operations of the electronic component 16.

The interconnection structure 14 may be disposed over the electronic components 12 and 13. In some arrangements, the interconnection structure 14 may be supported by the electronic components 12 and 13. In some arrangements, the interconnection structure 14 may overlap with the electronic components 12 and 13. For example, the interconnection structure 14 may cover the electronic components 12 and 13. The interconnection structure 14 may receive power from the power supply unit 11 through the power path P1 and provide multiple power paths to the electronic components 12 and 13.

The electronic device 4 may further include a power supply unit 11', electronic components 12', 13', 16', 17', and an interconnection structure 14'. The power supply unit 11', the electronic components 12', 13', 16', 17', and the interconnection structure 14' may be respectively similar to the power supply unit 11, the electronic components 12, 13, 16, 17, and the interconnection structure 14 in FIG. 1. Therefore, some details may correspond to the paragraphs above, and description thereof is not repeated hereinafter for conciseness.

The electronic components 12' and 13' may respectively be seated in one of the slots 10s of the carrier 10. In some arrangements, the electronic components 12 and 13 may be closer to the electronic component 16 than the electronic components 12' and 13'. In some arrangements, the electronic components 12' and 13' may be closer to the electronic component 16' than the electronic components 12 and 13.

The electronic components 12' and 13' may each include an expansion card, such as a graphics accelerator card, video card, sound card, network card, or other printed circuit board. The electronic components 12' and 13' may each be electrically connected to the electronic component 16' through the carrier 10. The electronic components 12' and 13' may each be configured to support or speed processing-intensive operations of the electronic component 16'.

In some arrangements, the electronic components 12' and 13' may each be configured to support or speed processing-intensive operations both of the electronic components 16 and 16'. The positions and number of the electronic components in the electronic device 4 are not intended to limit the present disclosure. For example, there may be any number of electronic components in the electronic device 4 due to design requirements.

The interconnection structure 14' may receive power from the power supply unit 11' through the power path P1' and provide multiple power paths to the electronic components 12' and 13'. For example, the interconnection structure 14' may be configured to receive power from the power supply unit 11' through a conductive element 11w', as illustrated by the power path P1. The conductive element 11w' may have one end connected to the power supply unit 11' by a connector 11t' and another end connected to the interconnection structure 14' by a connector 14t'.

The positions and number of the interconnection structures in the electronic device 4 are not intended to limit the present disclosure. For example, there may be any number of interconnection structures in the electronic device 4 due to design requirements.

In addition, the positions and number of the power supply units in the electronic device 4 are not intended to limit the present disclosure. For example, there may be any number of power supply units in the electronic device 4 due to design requirements. In some arrangements, the electronic components 12, 13, 12', and 13' may be configured to perform different functions, receive different types of power control, and/or receive different power voltages. There may be more power supply units configured to provide different voltages to the electronic components 12, 13, 12', and 13'.

Figure 5:
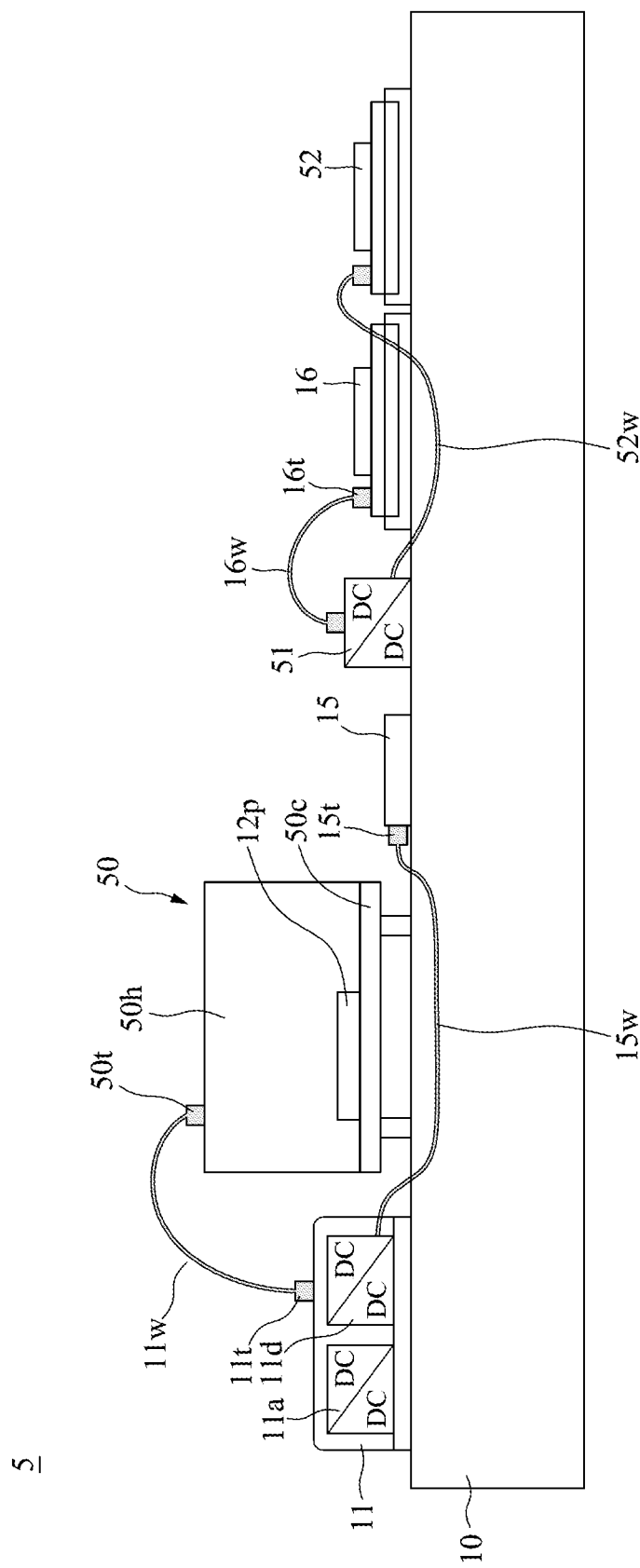
FIG. 5 is a side view of an exemplary electronic device according to some embodiments of the present disclosure.

FIG. 5 is a side view of an exemplary electronic device 5 according to some embodiments of the present disclosure. The electronic device 5 in FIG. 5 is similar to the electronic device 1 in FIG. 1, with differences therebetween as follows.

The electronic device 5 may include an electronic module 50. The electronic module 50 may be electrically connected to the carrier 10 through solder bonding, Cu-to-Cu bonding, or hybrid bonding. In some arrangements, the electronic module 50 may include a high performance computing (HPC) module.

In some arrangements, the electronic module 50 may include a carrier 50c, one or more processing units (such as the processing unit 12p) disposed over the carrier 50c, and a housing 50h. The carrier 50c may include, for example, a PCB, such as a paper-based copper foil laminate, a composite copper foil laminate, or a polymer-impregnated glass-fiber-based copper foil laminate. In some arrangements, the carrier 50c may include an interconnection structure, such as an RDL, a circuit layer, a conductive trace, a conductive via, etc. The housing 50h may be disposed over or on the carrier 50c to protect the processing unit 12p. The housing 50h may include a cover, an encapsulant, a leadframe, etc.

The electronic module 50 may support or provide the processes, activities, tools, and standards involved with operating, administering, managing and maintaining the one or more processing units (such as the processing unit 12p). For example, the electronic module 50 may support or provide operations, administration and management (OAM) techniques.

The electronic module 50 may be configured to receive power from the power supply unit 11 through the conductive element 11w and a connector 50t. The connector 50t may be similar to the connectors 11t and 14t as described with respective to FIG. 1.

The electronic component 15 may be configured to receive power from the power supply unit 11 through a conductive element 15w and a connector 15t.

The electronic device 5 may further include a DC/DC converter 51, the electronic component 16, and an electronic component 52. The electronic component 16 may be configured to receive power from the DC/DC converter 51 through a conductive element 16w and the electronic component 52 may be configured to receive power from the DC/DC converter 51 through a conductive element 52w. In some other arrangements, the DC/DC converter 51 may be integrated with the power supply unit 11.

According to some embodiments of the present disclosure, by providing power to the components electrically connected to the carrier 10 through the conductive elements 11w, 15w, 16w, and 52w, the power can be transmitted outside of a system board (such as the carrier 10). In other words, the power can be transmitted without passing through the system board. The issue of interference (such as noise or interference generated from the EMI field) between the power path and the non-power path (such as the signal path) can be resolved or alleviated. More I/O pins on the system board may be used to transmit signals. Therefore, the performance of the electronic device 5 can be enhanced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to +5%, less than or equal to +4%, less than or equal to +3%, less than or equal to +2%, less than or equal to +1%, less than or equal to ±0.5%, less than or equal to ±0.1%, or less than or equal to ±0.05%. For example, two numerical values can be deemed to be "substantially" the same or equal if a difference between the values is less than or equal to +10% of an average of the values, such as less than or equal to ±5%, less than or equal to +4%, less than or equal to +3%, less than or equal to ±2%, less than or equal to ±1%, less than or equal to ±0.5%, less than or equal to ±0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising: a system board; a first set of electronic devices disposed over the system board, wherein each of the first set of electronic devices comprises a processing unit and a carrier carrying the processing unit; and a first interconnection structure electrically connected with the processing unit through the carrier and configured to receive a first power from a first power supply unit and to transmit the first power to the processing unit, further comprising: a second set of electronic devices disposed over the system board; and a second interconnection structure electrically connecting with the second set of electronic devices and configured to receive a second power from a second power supply unit and transmit the second power to the second set of electronic devices, wherein the first set of electronic devices are closer to a first central processing unit (CPU) disposed over the system board than the second set of electronic devices, and the second set of electronic devices are closer to a second CPU disposed over the system board than the first set of electronic devices.

2. The electronic device of claim 1, wherein the system board carries the first power supply unit.

3. The electronic device of claim 2, wherein the first interconnection structure is configured to receive the first power from the first power supply unit through a conductive element outside the system board.

4. The electronic device of claim 3, wherein the first interconnection structure is configured to receive the first power from the first power supply unit without passing through the system board.

5. The electronic device of claim 1, wherein the first interconnection structure is carried by the first set of electronic devices.

6. The electronic device of claim 5, wherein the first set of electronic devices are detachable from the system board through the carrier.

7. The electronic device of claim 1, wherein the first set of electronic devices are disposed over the system board through the first interconnection structure.

8. The electronic device of claim 7, wherein the first interconnection structure is detachable from the system board.

9. A The electronic device of claim 1, wherein the first set of electronic devices are configured to support operations of the first CPU and the second set of electronic devices are configured to support operations of the second CPU.

10. An electronic device, comprising: a system board; a plurality of electronic devices disposed over the system board, wherein each of the plurality of electronic devices comprises a processing unit and a carrier carrying the processing unit; and an interconnection structure connected with the carrier of at least one of the plurality of electronic devices, wherein the carrier of the at least one of the plurality of electronic devices is configured to receive a first power from the interconnection structure and to receive a second power from the system board, wherein the second power further passes through the interconnection structure before being received by the carrier of the at least one of the plurality of electronic devices, wherein the selectively configuring further comprises opening a first analog switch of the at least one analog switch, the first analog switch being in the resistive path, and closing a second analog switch of the at least one analog switch, the second analog switch being in the path including the capacitor wherein the carrier of the at least one of the plurality of electronic devices is configured to receive a first power from the interconnection structure and to receive a second power from the system board.

11. The electronic device of claim 10, wherein the first power is transmitted from a power supply unit without passing through the system board.

12. The electronic device of claim 10, wherein a lateral surface of the carrier of at least one of the plurality of electronic devices is substantially perpendicular to a top surface of the system board.

13. The electronic device of claim 10, wherein the first power is greater than the second power.

14. An electronic device, comprising:
a system board;
a first electronic device comprising a first carrier and a first processing unit configured to receive a first power from the system board through the first carrier;
a second electronic device disposed over the system board, the second electronic device comprising a second carrier and a second processing unit carried by the second carrier; and
an interconnection structure electrically connected to the second electronic device and configured to transmit a second power from a power supply unit to the second processing unit without passing through the system board.

15. The electronic device of claim 14, wherein the interconnection structure support the first electronic device and the second electronic device.

16. The electronic device of claim 14, wherein the first carrier of the first electronic device is in contact with and electrically unconnected with the interconnection structure.

17. The electronic device of claim 14, wherein the first electronic device is electrically connected with the second electronic device through the system board.

* * * * *

UNITED STATES PATENT AND TRADEMARK OFFICE
CERTIFICATE OF CORRECTION

PATENT NO. : 11,991,827 B2
APPLICATION NO. : 17/966701
DATED : May 21, 2024
INVENTOR(S) : Chun-Yen Ting et al.

It is certified that error appears in the above-identified patent and that said Letters Patent is hereby corrected as shown below:

In the Claims

Column 14, Line 22, Claim 10 should read as follows:
10. An electronic device, comprising: a system board; a plurality of electronic devices disposed over the system board, wherein each of the plurality of electronic devices comprises a processing unit and a carrier carrying the processing unit; and an interconnection structure connected with the carrier of at least one of the plurality of electronic devices, wherein the carrier of the at least one of the plurality of electronic devices is configured to receive a first power from the interconnection structure and to receive a second power from the system board, wherein the second power further passes through the interconnection structure before being received by the carrier of the at least one of the plurality of electronic devices.

Signed and Sealed this
Third Day of September, 2024

Katherine Kelly Vidal
*Director of the United States Patent and Trademark Office*